(12) United States Patent
Weiss

(10) Patent No.: US 6,445,173 B1
(45) Date of Patent: Sep. 3, 2002

(54) PRINTED CIRCUIT BOARD TESTER

(75) Inventor: Stefan Weiss, Wertheim (DE)

(73) Assignee: atg Test Systems GmbH & Co. KG, Wertheim (DE)

( * ) Notice: Subject to any disclaimer, the term of this patent is extended or adjusted under 35 U.S.C. 154(b) by 20 days.

(21) Appl. No.: 09/656,088

(22) Filed: Sep. 6, 2000

(30) Foreign Application Priority Data

Sep. 10, 1999 (DE) .......................................... 199 43 388

(51) Int. Cl.[7] .............................................. G01R 31/02
(52) U.S. Cl. .................................... 324/158.1; 324/761
(58) Field of Search ........................ 324/158.1, 754–761, 324/762

(56) References Cited

U.S. PATENT DOCUMENTS

| | | | |
|---|---|---|---|
| 4,614,386 A | 9/1986 | Driller et al. | 339/17 M |
| 4,674,006 A | 6/1987 | Driller et al. | 361/393 |
| 4,851,765 A | 7/1989 | Driller et al. | 324/158 F |
| 4,922,190 A | 5/1990 | Reinholz | 324/158 F |
| 4,939,452 A | 7/1990 | Reinholz | 324/158 F |
| 4,952,872 A | 8/1990 | Driller et al. | 324/158 F |
| 5,764,069 A | 6/1998 | Cugini | 324/761 |
| 6,154,863 A | * 11/2000 | Prokopp | 324/158.1 |

FOREIGN PATENT DOCUMENTS

| | | |
|---|---|---|
| DE | 3340179 C1 | 11/1983 |
| DE | 3806792 A1 | 9/1989 |
| EP | 0 145 830 A1 | 6/1984 |
| EP | 3717528 A1 | 5/1987 |
| EP | 0 263 244 A1 | 7/1987 |
| EP | 0 145 830 B1 | 9/1987 |
| EP | 0 331 614 A1 | 2/1989 |
| EP | 0 263 244 B1 | 5/1991 |
| EP | 0 875 767 A2 | 10/1997 |

\* cited by examiner

*Primary Examiner*—Michael Sherry
*Assistant Examiner*—Roshni Kurian
(74) *Attorney, Agent, or Firm*—Hamilton, Brook, Smith & Reynolds, P.C.

(57) ABSTRACT

A printed circuit board tester includes an electronic analyzer and a grid pattern of contact points arranged in a regular pattern in a grid pattern plane. The contact points of the grid pattern are electrically connected to the electronic analyzer such that test points of a circuit board can be electrically scanned, whereby several contact points of the grid pattern are electrically interconnected. The circuit board is connectable to the contact points of the grid pattern by an adapter and/or a translator. The tester includes several grid bases, each of which comprises a contact point narrow side surface at which the contact points are arranged. The grid bases are provided with tracks, each of which is electrically connected to several contact points. Each track includes an electrical terminal connection leading to a terminal contact for connecting the electronic analyzer such that several contact points are electrically connected to a terminal contact. The grid bases are arranged with their contact point narrow side surfaces in the grid pattern plane for configuring the grid pattern.

22 Claims, 4 Drawing Sheets

FIG. 3

PRINTED CIRCUIT BOARD TESTER

RELATED APPLICATIONS

This application claims priority to German Application No. DE 199 43 388.7 filed Sep. 10, 1999 by Stefan Weiss.

This application is related to U.S. Ser. No. 08/956,583, filed Oct. 23, 1997, entitled "Printed Circuit Board Test Apparatus and Method", by Manfred Prokopp, the entire teachings of which is incorporated herein by this reference.

This application is related to U.S. Ser. No. 08/956,810, filed Oct. 23, 1997, entitled "Apparatus and Method for Testing Non-Componented Printed Circuit Boards", by Manfred Prokopp, the entire teachings of which is incorporated herein by this reference.

BACKGROUND OF THE INVENTION

The invention relates to a printed circuit board tester including an electronic analyzer and a grid pattern of contact points arranged in a regular pattern in a grid pattern plane. The contact points of the grid pattern are electrically connected to said electronic analyzer such that test points of a circuit board to be tested can be electrically scanned, whereby several contact points of said grid pattern are electrically interconnected. The circuit board is connectable to said contact points of said grid pattern by means of an adapter and/or a translator.

One such printed circuit board tester is known from EP 0 875 767 A2. This tester comprises a grid pattern on which an adapter and/or a translator is mounted on which a circuit board to be tested may be placed. The adapter and/or translator produces an electrical contact from the circuit board test points of the board under test to the contact points of the grid pattern. The contact points of the grid pattern are electrically connected to the test connections of an electronic analyzer so that each circuit board test point can be accessed by the electronic analyzer.

In this known tester several contact points of the grid pattern are electrically interconnected and are in each case in contact with a single test connection. As a result, the number of units of the electronic analyzer as compared to conventional circuit board testers is drastically reduced since each electronic unit permits access to a multiple of the contact points of the grid pattern. When, for example, arrays of 10 contact points of the grid pattern are to be electrically interconnected, then 10 times as many contact points can be accessed with an electronic unit than with conventional printed circuit board testers.

The electrically interconnected contact points of an array are arranged distributed over the grid pattern. This is the only way of assuring that no terminal contact is doubly assigned such that two circuit board test points are electrically connected to a common terminal contact.

The contact points of the grid pattern are configured on a multilayer circuit board. The layers of the multilayer circuit sandwich the tracks. The scan channels electrically interconnect the contact points.

This known printed circuit board tester has a proven record of success and features substantial advantages as compared to conventional testers. Fabricating the multilayer circuit board on which the contact points of the grid pattern are configured is, however, complicated since a plurality of scan channels needs to be incorporated. All of the scan channels must be faultless such that there must be no short-circuit to another scan channel and no scan channel must have an open-circuit. Fabrication in the case of a large-area grid pattern becomes expensive and extremely technically complicated, demanding highly sophisticated know-how.

There is thus a need for such a printed circuit board tester in which the contact points of the grid pattern are electrically interconnected that is nevertheless simple and thus cost-effective to fabricate.

DE 37 17 528 A1 describes a printed circuit board tester comprising a center-spacing adapter consisting of a stacked pack of circuit boards. Each circuit board is insulated from the other. Each circuit board is provided on one face with output contacts and two further opposing faces being provided with input contacts. The faces provided with the input contacts face two separate pattern arrays of test contacts. These test contact pattern arrays have a larger center-spacing than that of the output contacts. The object of this center-spacing adapter is to reduce the wide center-spacing of the terminal contact pattern arrays to the tight center-spacing of the circuit board test points.

EP 0 331 614 A1 relates to a printed circuit board tester adapter made up of several segments. Each segment consists of two circuit boards sandwiching contact pins. The contact pins are provided for contacting the printed circuit board test points and are electrically connected to the contact elements by means of tracks and plated through-holes incorporated in the circuit boards. These contact elements, which protrude from the side opposite the contact pins at each segment, are arranged with a larger center-spacing than that of the contact pins and serve to contact a contact array of an analyzer.

EP 0 263 244 A1 describes a printed circuit board tester including several driver boards. Each driver board comprises a contact array plug arranged juxtaposed in the tester so that the contact pins protruding from the contact array plugs form a uniform grid pattern. Arranged above this grid pattern are upright strip-like receptacle contact array members. Each contact array member is provided with a plurality of holes mounting spring elements. A test pin is inserted into each spring element so that it is electrically connected to the contact pins via the spring elements. The contact pins in turn are electrically connected to the driver board by wiring.

EP 0 145 830 A1 relates to a contact array for a printed circuit board tester. The contact array is formed by a number of driver cards arranged juxtaposed in parallel provided at one end with a contact plug in which the contact pins for contacting the circuit board test points are arranged. These contact plugs are arranged juxtaposed so that a uniform pattern of contact pins is configured.

DE 33 40 179 C1 describes a center-spacing adapter for translating an initial pattern on a large center-spacing to a final pattern having a close center-spacing. For this purpose two reduction planes are provided in which upright strip-like circuit boards are arranged densely packaged juxtaposed. Each of the circuit boards is provided with tracks whose center-spacing increases in the direction of the initial pattern, thus resulting in the tight center-spacing of the final pattern being formed on the larger center-spacing of the initial pattern.

SUMMARY OF THE INVENTION

The invention is an improvement of the aforementioned printed circuit board tester to enable it to be fabricated and serviced simpler and cheaper.

The printed circuit board tester in accordance with the invention comprises an electronic analyzer and a grid pattern of contact points arranged in a regular pattern in a grid pattern plane. The contact points of the grid pattern are electrically connected to the electronic analyzer such that test points of a circuit board to be tested can be electrically scanned, whereby several contact points of the grid pattern are electrically interconnected. The circuit board is connectable to the contact points of the grid pattern by means of an adapter and/or a translator.

The tester in accordance with the invention includes several grid bases, each of which comprises a contact point narrow side surface at which the contact points are arranged. The grid bases are provided with tracks. Each track is electrically connected to several contact points. In addition, each track includes an electric terminal connection leading to a terminal contact for connecting the electronic analyzer so that several contact points are electrically connected to a terminal contact. The grid base circuit boards are arranged with their contact point narrow side surfaces in the grid pattern plane for configuring the grid pattern.

Due to the configuration of the printed circuit board tester in accordance with the invention, the grid pattern is not formed by a single circuit board. The contact points of the grid pattern instead are arranged at the contact point narrow side surfaces of the grid bases such that a plurality of grid bases form by their contact point narrow side surfaces, a surface area not necessarily integral in which the grid pattern is configured. By providing the grid bases, the tracks interconnecting the contact points can now be arranged distributed over the full surface area of the grid bases. This substantially facilitates their fabrication as compared to the configuration of the grid pattern on a multilayer circuit board as described in the prior art. In the prior art, the scan channels are configured in the individual layers as thin conductor wires located very closely to each other. With the grid bases in accordance with the invention, the tracks can now be provided substantially wider since the space available in this case is merely restricted by the center-spacing of the grid pattern and the size of the grid bases which is practically optionally selectable.

The grid bases stand preferably upright on the grid pattern plane. In an alternative embodiment, the grid bases can be arranged inclined to the grid pattern plane. The contact point narrow sides surfaces are then configured correspondingly inclined to the side surfaces of the grid bases so that they form a flat surface area on which an adapter and/or a translator can be placed.

Preferably the grid bases are configured multilayer. Each layer is separated from the other by an electrically insulating interlayer 16. Each of the contact points is electrically connected to a contact point track extending transversely to the contact point narrow side surfaces. Several bus tracks extending transversely to the contact point tracks are provided on one surface of a layer on which no contact point tracks are arranged. Each of which is electrically connected to one of the bus tracks by means of a plated through-hole so that the plurality of contact points is thus guided with the contact point tracks to a relatively small number of bus tracks. These bus tracks produce the electric connection between several of the contact point tracks. The terminal contacts for the electronic analyzer may be provided both on the bus tracks and on a corresponding number of contact point tracks. The arrangement of the electrically interconnected contact points of the grid pattern is dictated by the arrangement or pattern of the plated through-holes on the grid bases. This is because the arrangement of the plated through-holes defines which bus track is electrically connected to which contact point track and accordingly to which contact point of the grid pattern. Producing such plated through-holes is technically no problem and thus the arrays of electrically interconnected contact points are defined by simple ways and means.

In one preferred embodiment the terminal contacts of differing grid bases are electrically interconnected by means of a link board. Connecting the link board are electronic units of the electronic analyzer which are electrically connected to the terminal contacts of the grid bases via the tracks of the link board.

In another embodiment the bus tracks may be provided with bus contact points whereby several bus contact points may be electrically interconnected so that the contact points of differing grid bases are electrically interconnected. For electrically connecting several bus tracks, a link board is preferably used which can be placed on the bus contact points.

BRIEF DESCRIPTION OF THE DRAWINGS

The invention will now be detailed by way of example embodiments with reference to the schematic drawings in which:

FIG. 3 is a simplified schematic top view illustration of part of the grid base.

Figure 1:
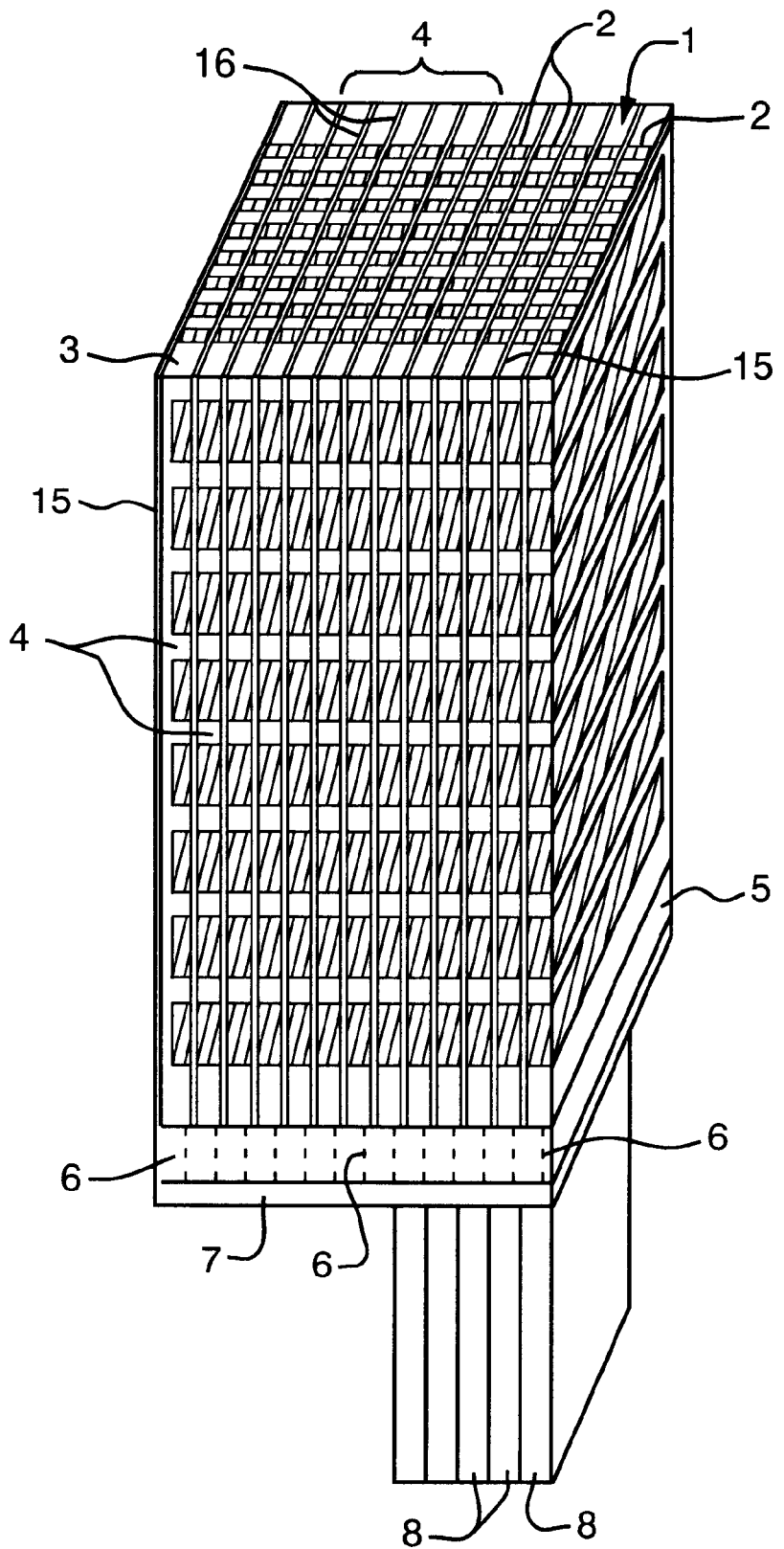
FIG. 1 is a schematic illustration of a pack of grid bases, on the top surface of which the grid pattern is configured.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

FIG. 1 illustrates a printed circuit board tester in accordance with the invention comprising a grid pattern 1 configured by a plurality of contact points 2 arranged in a regular pattern in a grid pattern plane.

The contact points 2 are arranged at narrow side surfaces (i.e., the contact point narrow side surfaces 3 of the grid bases 4). The grid bases are arranged stacked with their side surfaces in contact forming a cuboid pack. In the example embodiment as shown in FIG. 1 the grid pattern 1 is provided at the top side of this pack. In an alternative embodiment, the pack is arranged with the grid pattern 1 facing downwards. Such an arrangement is used, for example, with double-sided testers in which two grid patterns are arranged opposite each other.

Figure 2A:
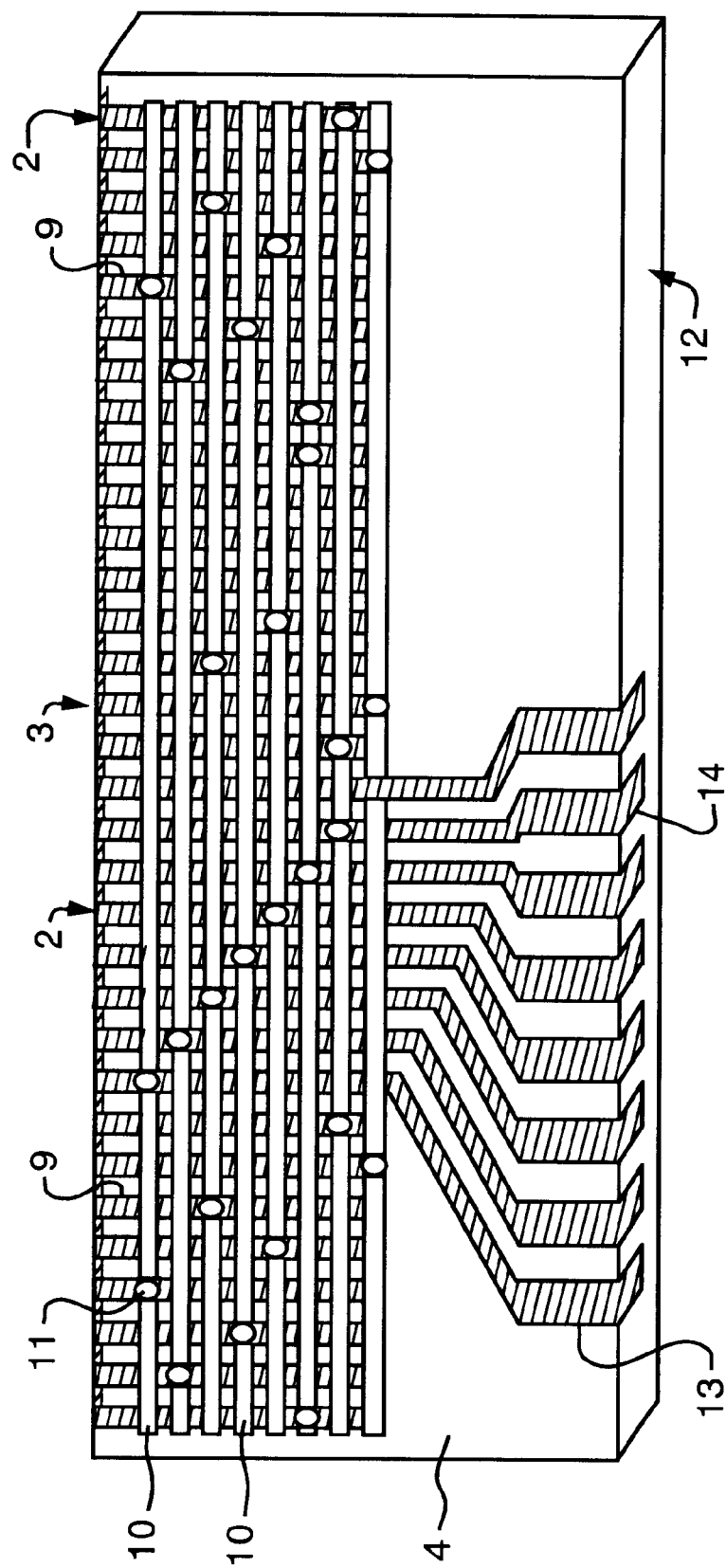
FIGS. 2a and 2b are schematic illustrations of a grid base with its tracks.
Figure 2B:
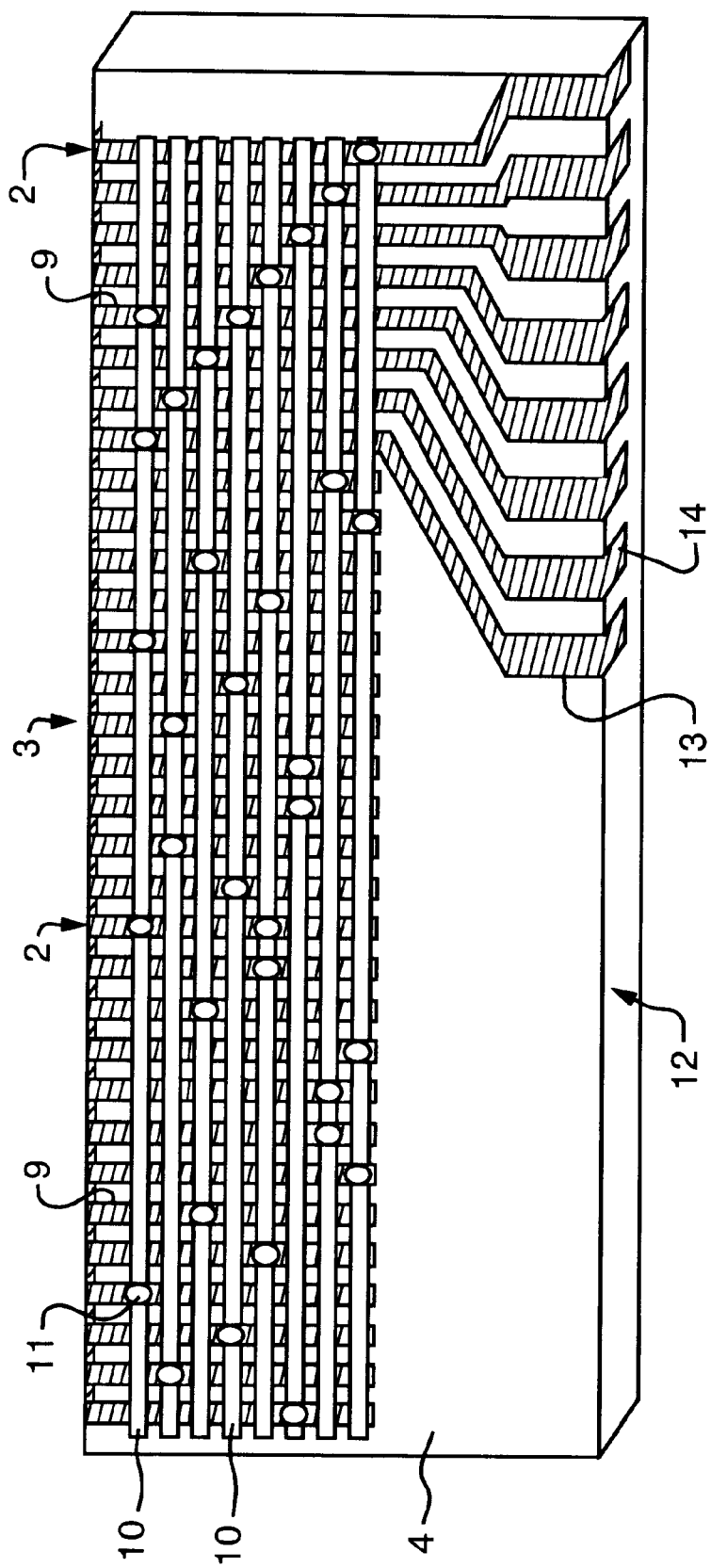

Referring to FIG. 2a and 2b, the grid bases 4 comprise tracks or strip conductors which electrically link the contact points 2 into arrays of contact points 2. The tracks are described in more detail below. Configured at the narrow side surfaces 12 of the grid bases 4 opposite the contact point narrow side surfaces 3 are terminal contacts 14. Terminal contacts 14 represent a contact point pattern having however substantially larger center-spacings than the grid pattern since each terminal contact is assigned several contact points 2 of the grid pattern.

In the example embodiment as shown in FIG. 1 the terminal contacts 14 are not visible since they are arranged on the underside of the pack of grid bases 4. The grid bases 4 mate with a full pattern cassette 5 in which receptacle contact pins 6 are provided in the pattern of the terminal contacts 14 such that each terminal contact 14 is in contact with a receptacle contact pin 6. The receptacle contact pins 6 are arranged parallel to each other in the full pattern cassette 5, protruding somewhat from the underside of the full pattern cassette 5 so that they are able to make contact with contact locations of a link board 7.

The link board 7 is a circuit board with contact locations electrically interconnected by means of tracks. The contact locations directly contact the receptacle contact pins 6 such that arrays of terminal contacts 14 of differing grid bases 4 are formed electrically interlinked. The configuration of the link board is similar to that of the aforementioned circuit board for forming the grid pattern as it reads from EP 0 875 767 A2. Since the pattern of the terminal contacts 14 is substantially coarser than that of a grid pattern, the number of contact locations and tracks is correspondingly less, making such a link board 7 simpler to fabricate.

At the side of the link board 7 facing away from the full pattern cassette 5, the tracks of the link board 7 end at further contact locations to which electronic units 8 of the electronic analyzer are connected.

Referring now to FIGS. 2a and 2b the structure of the tracks of the grid bases 4 are shown with each contact point 2 of the grid pattern 1 being electrically connected to a contact point track 9. The contact point track 9 extends transversely to the contact point narrow side surface 3 of the grid base 4. These contact point tracks 9 are configured on a side surface of the grid base 4. Configured on the opposite side surface of the grid base 4 are bus tracks 10 extending transversely to the contact point tracks. Each contact point track 9 is electrically connected to a bus track 10 by means of plated through-hole 11 extending through the grid base 4. The plated through-hole is a through-hole plated with electrically conducting material. The plated through-holes are arranged at the intersections of each contact point track 9 with each bus track 10 electrically interconnecting the tracks 9 and 10.

Electrically connected to a bus track 10 of a grid base 4 are several contact point tracks 9 and thus several contact points 2. The electrical connection or linking of the contact points 2 by means of the bus tracks 10 is defined by the pattern with which the plated through-holes 11 are drilled into the grid bases.

Some of the contact point tracks 9 are guided by a terminal connection 13 to one of the narrow side surfaces opposite the contact point narrow side surface 3 (i.e. the terminal contact narrow side surface 12 of the grid bases 4). Configured at the terminal contact narrow side surface 12 are terminal contacts 14. The number of terminal connections 13 corresponds to the number of bus tracks 10 or the number of the electrically interconnected arrays of contact points 2.

Each of these circuit boards is configured with one row each of contact points 2, a set of contact point tracks 9 and bus tracks 10 on a thin layer of circuit board material. Several of these layers are laminated into a grid base. In this arrangement, insulating interlayers 16 are sandwiched by the individual layers which may consist of prepreg layers. Such a multilayer grid base comprises for each layer a row of contact points 2. The terminal connections 13 of adjacent layers are arranged staggered preferably in the longitudinal direction of the bus tracks 10. This arrangement allows the terminal contacts 14 to extend over several layers and to have correspondingly large surfaces arranged in a regular pattern.

The contact points 2 of the grid pattern 1 are thus arranged substantially denser than the terminal contacts 14. With the grid bases 4 in accordance with the invention, a transformation is also thus achieved from the coarse pattern of the terminal contacts 14 to fine grid pattern 1.

Due to the linking by means of the bus tracks 10 and the link board 7, arrays of, for example, sixty (60) contact points 2 each of the grid pattern 1 can be electrically interconnected. For a grid pattern of 491,520 contact points 2, only 8,192 test points result on the output side of the link board 7 in contact with the electronic units 8. This illustrates that a large number of contact points 2 can be accessed with a few electronic units.

In this example embodiment involving 491,520 contact points, these are arranged on a center-spacing of 0.635 mm (25 mil) for example. The individual layers of the grid base 4 comprise the same center-spacing (i.e. their thickness together with the adjoining insulating interlayer 16 likewise being 0.635 mm).

Figure 3:
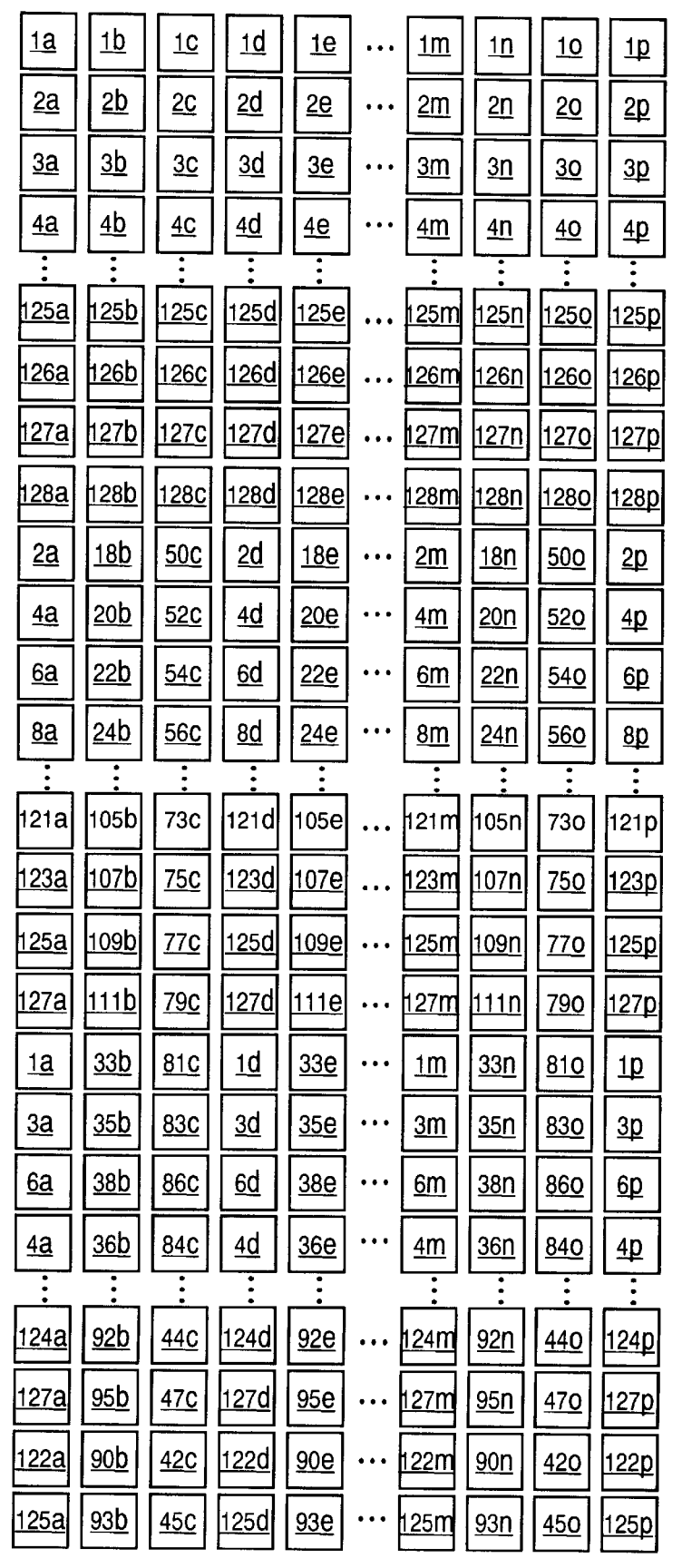

FIG. 3 is a schematic illustrating part of one such grid pattern 1 showing schematically a block of grid bases 4 in which there is no link between contact locations of differing grid bases and thus no links between contact locations of differing grid bases by means of the link board within a block. Such links are provided merely between the blocks.

In each of the grid bases a to p, 128 arrays of interlinked contact points are represented by the array number of each being entered at the contact points. In accordance with this preferred arrangement, adjacent contact points in a block are each assigned to differing arrays, (i.e., no two adjacent contact points are assigned to the same arrays as two other adjacent contact points). This ensures that the two adjacent contact points of the grid pattern can be defined should a short-circuit be found between two adjacent contact points when debugging the grid pattern in accordance with the invention so that it can be simply debugged blockwise.

As evident from FIG. 3 each of the grid bases a,d,m,p and b,e,n or c,o respectively has the same connection structure, (i.e., the same pattern of plated through-holes for connecting contact point tracks to the bus tracks). This enables, with but three different connection structures, blocks to be achieved in which adjacent contact points are each assigned to differing arrays of linked contact points.

The face surfaces of the grid bases 4 are provided with an insulator layer 15, which is, for example, a resist or a further prepreg layer.

The example embodiment as described above shows that the bus tracks 10 may be provided practically in any width and that the contact point tracks 9 can be applied to the face surface of the individual layers with a width corresponding to the center-spacing of the grid pattern 1. These tracks can thus be photo etched. This is a major advantage over the tester of the prior art in which the corresponding tracks are located very close to each other in a single circuit board covering the complete grid pattern. The individual layers of the grid bases 4 in accordance with the invention are exposed in fabrication with the same sets of films for configuring the tracks since the individual layers differ merely in the terminal contacts and in the drilling pattern. The remaining tracks are the same for all layers. One set of films is thus sufficient for each type of layer having a specific arrangement of terminal contacts. This specific embodiment thus permits highly cost-effective fabrication. The number of bus tracks is restricted only by the height of the grid bases which is, however, freely selectable. Tests have shown that a number of bus tracks in the range 30 to 60 serves a circuit board height of the upright, strip-shaped grid bases which is substantially less than their length.

In conventional grid patterns the contact between the contact points and the corresponding electrical connections is configured by means of a plated through-hole so that small holes are incorporated in the sheet-like contact points. These holes may negatively affect the contact to the corresponding contact pins of an adapter arranged on the grid pattern. Since the contact points 2, in accordance with the invention, electrically connect the contact point track 9 arranged on the surface of the layers or grid base, the contact point track 9, and the contact points 2 being configured as a full-length track, there are no holes in the region of the contact points. This contributes towards avoiding faulty contacts.

According to one embodiment, the contact points configured as gold films. Since the contact points 2 are arranged on the contact point narrow side surfaces 3 and are simple to remove from the grid pattern 1, the contact points 2 may be re-applied should they be destroyed. This aspect, in accordance with the invention, of providing grid bases thus permits simple maintenance of the grid pattern.

The invention is detailed above by way of an example embodiment. However, it will be readily appreciated that modifications are possible without departing from the spirit and scope of the invention. Thus, it is, for example, not necessary that a link board 7 be provided which electrically interconnects the tracks of the various grid bases or differing layers thereof. When no link board 7 is provided, all terminal contacts 14 of the grid bases 4 are to be electrically connected to a corresponding terminal contact 14 of the electronic units 8 in each case. It is also possible without departing from the spirit and scope of the invention to extend the bus tracks 10 up to a narrow side surface of the grid bases extending transversely to the contact point narrow side surface 3 and to provide it with corresponding bus contact points for accessing a link board 7 independently of the electronic analyzer for electrically connecting predefined bus tracks.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A printed circuit board tester, comprising
   an electronic analyzer;
   a grid pattern of contact points arranged in a regular pattern in a grid pattern plane, said contact points of said grid pattern being electrically connected to said electronic analyzer such that test points of a circuit board to be tested can be electrically scanned, said circuit board being connectable to said contact points of said grid pattern by an adapter, an array of said contact points of said grid pattern being electrically interconnected;
   grid bases, each of said grid bases comprising a contact point narrow side surface, said contact point narrow side surface having an arrangement of said contact points, said grid bases having tracks, each track being electrically connected to said array of contact points, each track comprising a terminal connection leading to a terminal contact for connecting said electronic analyzer such that said array of said contact points are electrically connected to a terminal contact; and
   wherein each of said grid bases are arranged with said contact point narrow side surface in said grid pattern plane for configuring said grid pattern.

2. The tester of claim 1,
   wherein each terminal connection ends at a terminal contact, the center-spacing of adjacent terminal contacts being greater than the center-spacing of adjacent contact points of said grid pattern.

3. The tester of claim 2,
   wherein said terminal contacts on said grid bases are arranged on said narrow side surfaces opposite said contact point narrow side surfaces.

4. The tester of claim 1,
   wherein said grid pattern is divided into blocks in which adjacent contact points are assigned to differing arrays of electrically interconnected contact points.

5. The tester of claim 1
   wherein said circuit board is connectable to said contact points of said grid pattern by a translator.

6. The tester of claim 1,
   wherein said grid bases are arranged stacked with surfaces of said grid bases adjoining.

7. The tester of claim 6,
   wherein said grid bases comprise multiple layers, each layer of said multiple layers being separated from the other by an electrically insulating interlayer, the insulating interlayer electrically insulating a first layer of said multiple layers from a second layer of said multiple layers;
   wherein each of said contact points is electrically connected to a contact point track extending transversely to said contact point narrow side surface; and
   wherein provided on one face surface of a layer are bus tracks, each contact point track being electrically connected to one of said bus tracks by a plated through-hole.

8. The tester of claim 7,
   wherein at least two of said bus tracks are electrically interconnected.

9. The tester of claim 8,
   wherein groups of terminal contacts are electrically interconnected by a link board.

10. The tester of claim 9,
    wherein said bus tracks extend to side surfaces areas of said grid bases extending transversely to said contact point narrow side surface, bus contact points being configured on said grid bases via which predefined bus tracks can be electrically interconnected by a link board.

11. The tester of claim 10,
    wherein said grid pattern is divided into blocks in which adjacent contact points are assigned to differing arrays of electrically interconnected contact points.

12. The tester of claim 7,
    wherein contact point tracks are electrically connected to a common bus track and only one of said contact point tracks is provided with a terminal connection for connecting said electronic analyzer.

13. The tester of claim 7,
    wherein a thickness of one of said multiple layers and of said interlayer corresponds to a spacing of adjacent contact points of said grid pattern.

14. The tester of claim 13,
    wherein said side surfaces of said grid bases are provided with an insulator layer.

15. The tester of claim 14,
    wherein said insulator layer is a resist.

16. The tester of claim 14,
wherein said insulator layer is a prepreg layer.

17. The tester of claim 14,
wherein contact point tracks are electrically connected to a common bus track and only one of said contact point tracks is provided with a terminal connection for connecting said electronic analyzer.

18. The tester of claim 14,
wherein each terminal connection ends at a terminal contact, the center-spacing of adjacent terminal contacts being greater than the center-spacing of adjacent contact points of said grid pattern.

19. The tester of claim 18,
wherein said terminal contacts on said grid bases are arranged on said narrow side surfaces opposite said contact point narrow side surfaces.

20. The tester of claim 19,
wherein at least two of said bus tracks are electrically interconnected.

21. The tester of claim 20,
wherein said bus tracks extend to side surfaces areas of said grid bases extending transversely to said contact point narrow side surface, bus contact points being configured on said grid bases via which predefined bus tracks can be electrically interconnected by a link board.

22. The tester of claim 20,
wherein groups of terminal contacts are electrically interconnected by a link board.

* * * * *